(12) United States Patent
Jones et al.

(10) Patent No.: US 7,728,576 B1
(45) Date of Patent: Jun. 1, 2010

(54) PROGRAMMABLE MULTI-CHANNEL AMPLITUDE AND PHASE SHIFTING CIRCUIT

(75) Inventors: Keith W. Jones, Monument, CO (US); Christophe Pierre, Dexter, MI (US); Steven L. Ceccio, Scio Township, MI (US); John Judge, Severna Park, MD (US); Steve Fuchs, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 1489 days.

(21) Appl. No.: 10/751,491

(22) Filed: Jan. 7, 2004

(51) Int. Cl.
*G01R 25/00* (2006.01)
*G01R 29/00* (2006.01)
*G01R 13/02* (2006.01)
*G01D 18/00* (2006.01)
*G01R 35/00* (2006.01)

(52) U.S. Cl. ............... 324/76.77; 324/76.78; 324/76.79; 324/76.8; 324/76.81; 324/76.82; 702/85; 702/106; 702/108; 702/112

(58) Field of Classification Search ............... 370/493; 375/259; 700/94; 381/1, 77, 97, 98; 324/622, 324/76.77–76.83; 702/1, 57, 66, 71, 72, 702/85, 108, 109, 112; 73/1.01, 1.88, 865.8, 73/865.9

See application file for complete search history.

(56) References Cited

U.S. PATENT DOCUMENTS

| | | | |
|---|---|---|---|
| 4,663,594 A | 5/1987 | Perkins | |
| 4,737,703 A | 4/1988 | Hayakawa | |
| 4,782,246 A | 11/1988 | Kuroyanagi et al. | |
| 5,317,200 A | 5/1994 | Nishiyama | |
| 7,123,724 B1 * | 10/2006 | Pfaffinger et al. | ............ 381/1 |
| 2002/0001317 A1 * | 1/2002 | Herring | ............ 370/493 |

\* cited by examiner

*Primary Examiner*—Vivian Chin
*Assistant Examiner*—George C Monikang
(74) *Attorney, Agent, or Firm*—AFMCLO/JAZ; Gina S. Tollefson; Daniel J. Krieger

(57) ABSTRACT

The traveling wave excitation system phase shifter chassis method and device of the invention is compact, inexpensive, and versatile when compared to customary methods for generating traveling wave excitation signals that would require using an equivalent number of commercial function generators. The method and device of the invention produces up to 56 simultaneous sine waves that are phase shifted with respect to one another.

14 Claims, 4 Drawing Sheets

Amplitude / Phase Shifting Circuit Board

PROGRAMMABLE MULTI-CHANNEL AMPLITUDE AND PHASE SHIFTING CIRCUIT

RIGHTS OF THE GOVERNMENT

The invention described herein may be manufactured and used by or for the Government of the United States for all governmental purposes without the payment of any royalty.

BACKGROUND OF THE INVENTION

The invention relates to providing multiple sinusoidal voltage signals at the same frequency or simultaneously sweeping in frequency, each having a programmable amplitude and phase.

Several applications in structural dynamics testing and active vibration and acoustic control require multiple excitations programmed at specific amplitudes and phases. The excitations may be used to simulate rotational forces, excite particular vibration modes of a structure, or cancel unwanted vibration or noise. These multiple excitations require multiple channels of signal generation with programmable amplitude and phase.

A simple, prior art method of phase shifting a signal is to pass it through an analog circuit with an inductive and resistive load. The amount of phase the circuit provides could be controlled with a programmable resistor which changes the phase response of the circuit. The problem with this method is that the change in resistance also changes the amplitude response of the circuit. Therefore, this method has the disadvantage that only an arbitrary phase or amplitude can be commanded on each channel, but not both.

Another prior art method is where both amplitude and phase can be adjusted using a single-channel phase shifter. Multiple single-channel phase shifters can be referenced to the same input sinusoid to create multiple phased sinusoid outputs. The problem with this system is its lack of programmability. The user must manually adjust a gain and phase knob on each channel. At best, these adjustments would have to be made any time the user desired to change his test set-up with a different arrangement of amplitudes and phases on the channels. At worst, these adjustments would have to be made for every frequency change when controlling actuators with slightly different frequency responses. Each single phase shifter is programmable and can be controlled via standard GPIB instrument control. One disadvantage of this system is that each module can only adjust the phase and not the amplitude of each channel. Also, this system uses a programmable time delay to cause the phase shift. The user is required to manually input (via software) the time delay directly or the frequency of the input waveform. Therefore, the second disadvantage is that automatic phased frequency sweeps are not possible with this system and changing frequency manually to perform a sweep test would be cumbersome and time consuming.

Another prior art approach for producing programmable amplitude and phase-shifted sinusoids is to use multiple phase-locking commercial function generators. The disadvantage of this method is its expense for large numbers of channels such as those that might be needed to excite a bladed disk. (Some bladed disks have over 100 blades).

Therefore, there exists a need in the art for an inexpensive programmable multiple channel amplitude and phase shifter which can operate either at a single frequency or sweep in frequency. The traveling wave excitation system phase shifter chassis method and device of the invention is compact, inexpensive, and versatile when compared to customary methods for generating traveling wave excitation signals.

SUMMARY OF THE INVENTION

The programmable, multiple channel amplitude and phase shifting circuit device and method of the invention is compact, inexpensive, and versatile when compared to customary methods for generating traveling wave excitation signals that would require using an equivalent number of commercial function generators. The method and device of the invention produces up to 56 simultaneous sine waves that are phase shifted with respect to one another. The preferred arrangement of the invention utilizes a standard personal computer 24-channel digital interface port by which the amplitude of each sine wave can be adjusted. Ideally, the invention permits operation of two chassis—for up to 112 channels of phased sinusoids—from a single computer interface port.

It is therefore an object of the invention to provide an inexpensive, multiple channel amplitude and phase shifter.

It is another object of the invention to provide a programmable multiple channel amplitude and phase shifter It is another object of the invention to provide a compact programmable multiple channel amplitude and phase shifter.

DETAILED DESCRIPTION

The amplitude and phase shifting circuit of the invention creates phase shifted sine waves with the following trigonometric identity:

$$A \sin(\omega t+\theta)=B \cos(\omega t)+C \sin(\omega t) \tag{1}$$

$$B=A \sin(\theta) \tag{2}$$

$$C=A \cos(\theta) \tag{3}$$

where A is the desired output amplitude (volts), $\omega$ is the sinusoid frequency (Hz), t is time (sec), $\theta$ is the desired phase angle (radians), and B and C are constants.

The method in equations (1-3) was implemented using two programmable operational amplifiers (for gains B and C) and one summing operational amplifier per channel. A personal computer sets B and C using a National Instruments™ digital output card and LabVIEW™ software. These digital output cards and software are described by way of example are not invented to limit other arrangements of invention. A standard two-channel function generator is used to supply the required $\sin(\omega t)$ and $\cos(\omega t)$ waveforms. However, any traveling wave generating device may be used.

Figure 1:
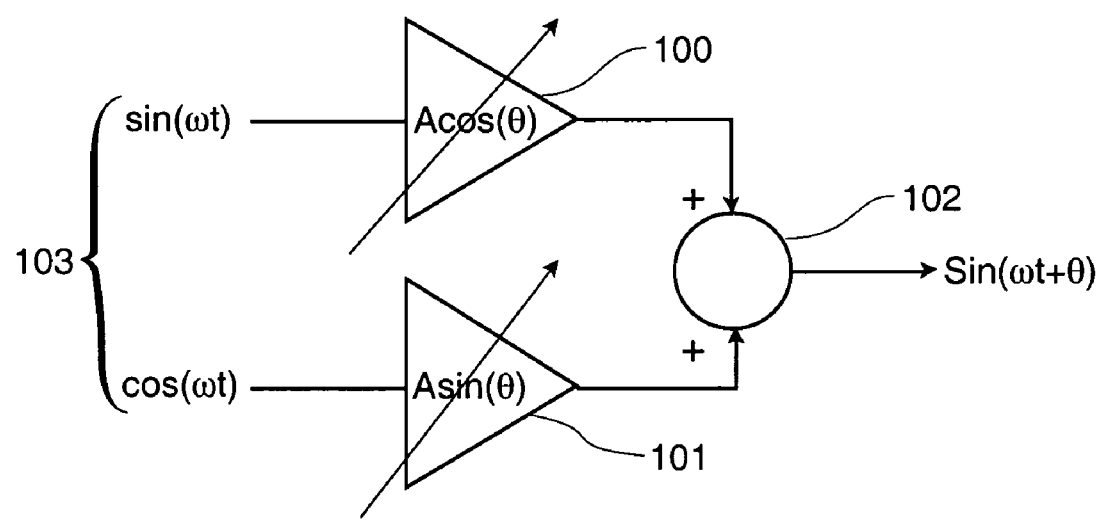
FIG. 1 shows a conceptual amplitude and phase shifting circuit.

A conceptual diagram of this circuit for a single channel is shown in FIG. 1. Two programmable operational amplifiers are shown at 100 and 101. A summing operational amplifier is shown at 102 and $\sin(\omega t)$ and $\cos(\omega t)$ waveforms, generated by a two-channel function generator, are shown at 103. The circuit shown in FIG. 1 is then repeated for as many channels of signal generation.

Figure 2:
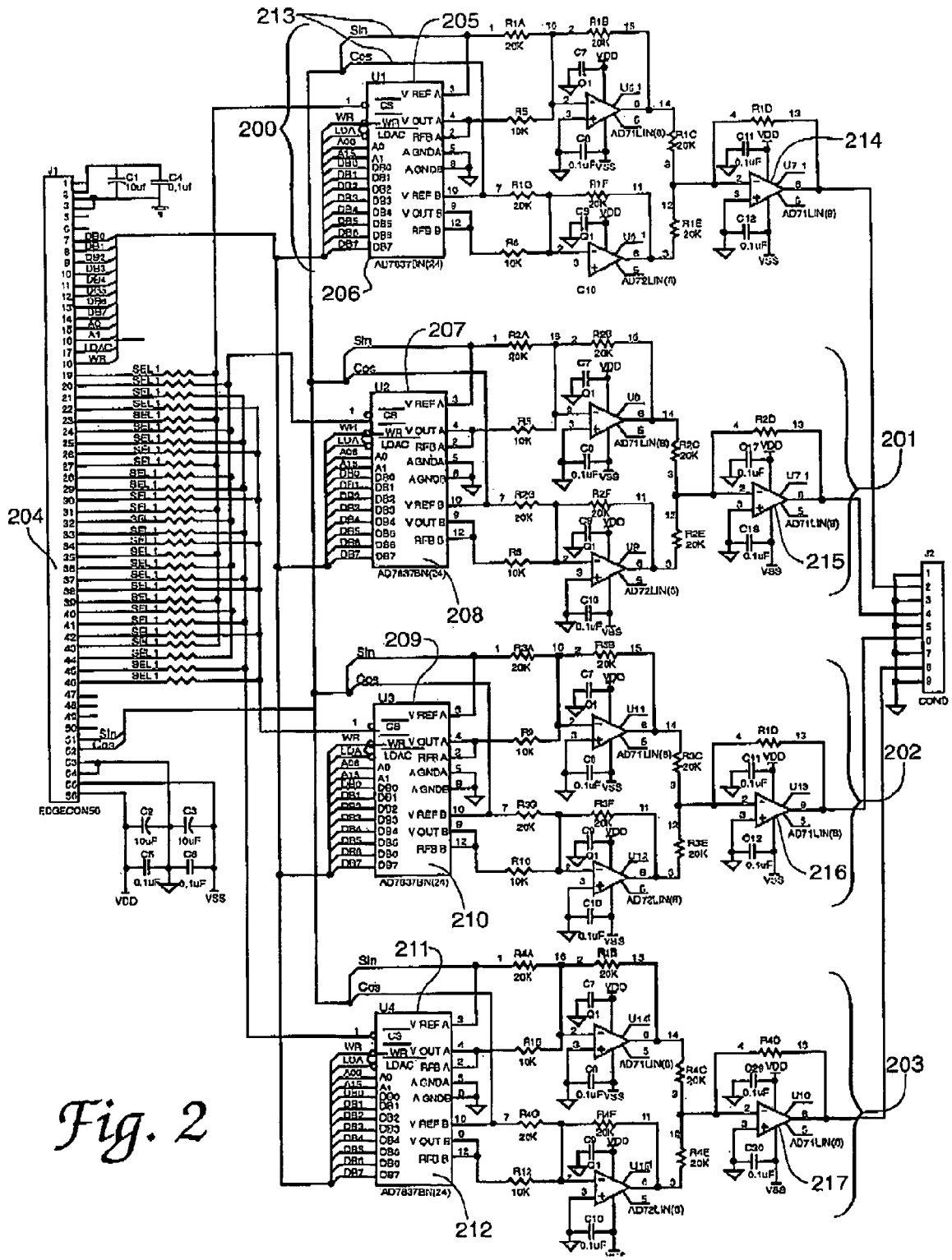
FIG. 2 shows a schematic of the amplitude and phase shifting circuit of the invention.

FIG. 2 shows a schematic of an amplitude/phase shifting circuit board with each printed circuit board implementing four channels of the output circuit show in FIG. 1. Each board contains a matrix of selector jumpers that allow assignment of its four channels, shown at 200 through 203, among the 28 select lines coming from the demultiplexer chips, shown at 204. The circuit board has 8 programmable gain operational amplifiers, illustrated at 205-212. Each programmable gain amplifier is connected to 8 data lines, 4 control lines, and 1 chip select line from the motherboard. The chip select line must be low for the programmable gain amplifier to respond to any control or data lines. The 4 control lines determine the timing and sequencing of reading the data lines, storing the data in a buffer, and changing the gain of the operational amplifier. The 8 data lines send a 12 bit digital number corresponding to a gain between 1 and ±1. The input sine and cosine wave, shown at 213 for the first channel, are input to the programmable gain operational amplifiers and then summed with another operational amplifier, the summing operational amplifiers shown at 214 through 217 in FIG. 2 and as shown at 102 in FIG. 1. The final phase and amplitude shifted sinusoid is then sent to an output connector at the top of the card. The output connector is then wired to the BNC patch panel on the outer case.

Figure 3:
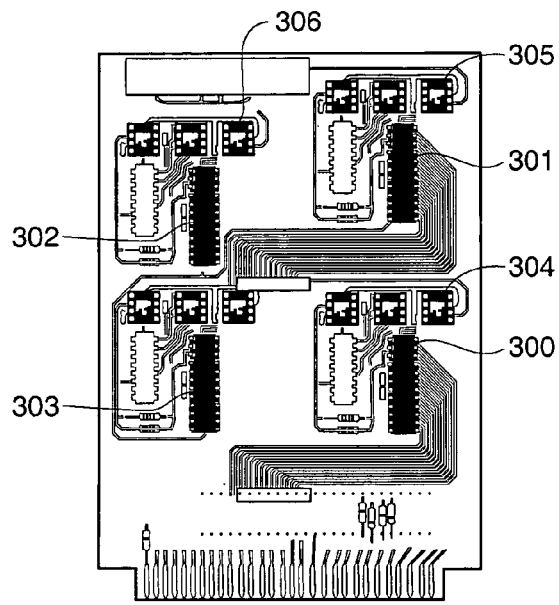
FIG. 3 shows an amplitude and phase shifting circuit of the invention.

FIG. 3 shows a top view of an amplitude and phase shifting circuit of the invention. The operational amplifiers of FIGS. 1 and 2 are shown for two channels at 300 and 301 in FIG. 3.

Figure 4:
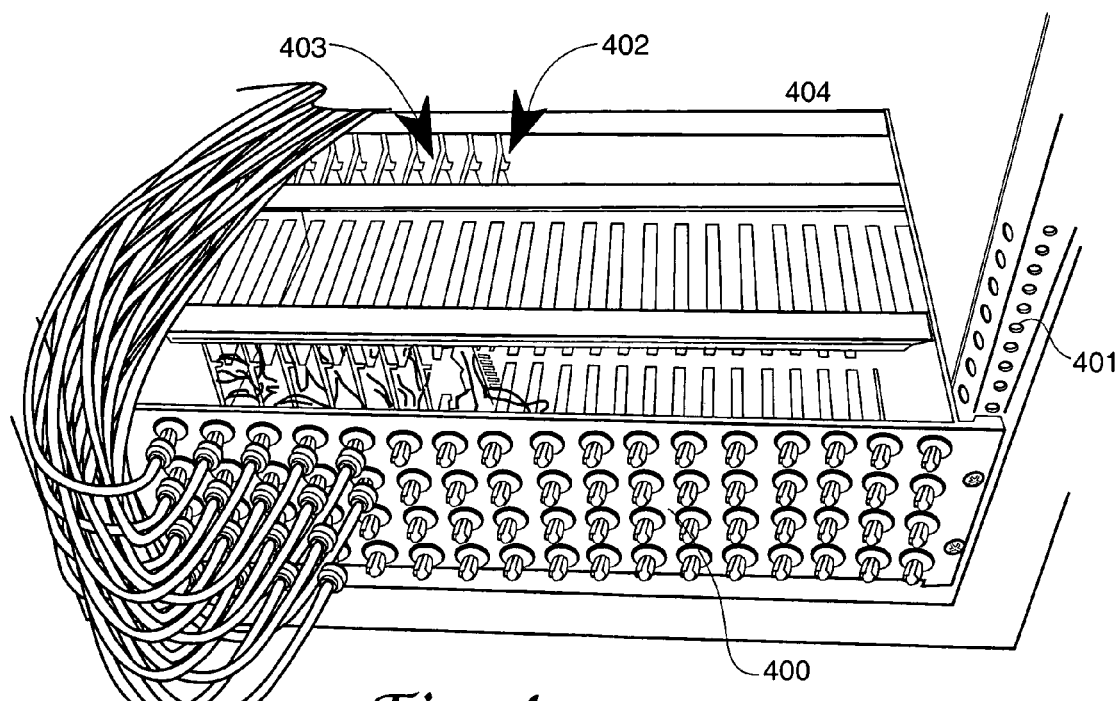
FIG. 4 shows a 28 channel phase shifting circuit of the invention.

In a preferred arrangement of the invention, the amplitude and phase shifting circuit of the invention consists of an enclosure, a motherboard, a demultiplexer circuit board and an amplitude/phase shifting circuit board. The overall installed 28 channel phase shifting circuit of the invention is shown in FIG. 4. The enclosure is shown at 400 in FIG. 4 and consists of a card cage to hold the printed circuit boards interfaced with the motherboard. The enclosure also provides a front panel for the sine and cosine input signals and the phase shifted outputs. The enclosure mounts into a standard 19 inch electronics rack, illustrated at 401.

The motherboard, illustrated at 402, is used to supply the demultiplexer circuit board and the amplitude and phase shifting circuit boards, illustrated at 403, with power, digital control lines, and the sine and cosine input signals. One circuit board in the motherboard is reserved for a demultiplexer circuit board, illustrated at 404 in FIG. 4.

The demultiplexer circuit board consists of a 50-pin ribbon cable connector to accept the digital control lines coming from digital output card in a personal computer. Five digital control lines are rounted from the pin connector to two 4-line to 16-line demultiplexer chips. The rest of the digital control lines from ribbon cable connector are routed directly to the motherboard to be available to the amplitude/phase shifting circuit boards.

The demultiplexer output lines are routed into the motherboard so that they are available to the amplitude and phase shifting circuit boards. Each demultiplexer output line is connected to a different multiplying operational amplifier chip select line on the amplitude/phase shifting circuit board. The demultiplexer chips select one amplifier at a time to have its gain changed when the user desires a new amplitude or phase to be set on one of those channels.

The programmable multiple channel amplitude and phase shifting circuit of the invention must be controlled with some type of digital output. In the preferred arrangement of the invention, the circuit is controlled with a digital output card from a personal computer. However, other methods may be implemented and a digital output card is described by way of example, only. The digital output card interfaces with the phase shifting circuit through a 50 pin ribbon cable. The user interfaces with the digital output card with some type of software. The current configuration uses LabVIEW™ software. The user simply types in the desired amplitude and phase on each channel and the LabView™ software sends the appropriate digital commands to the programmable gain amplifiers to change their gains according to equations (1-3).

Figure 5:
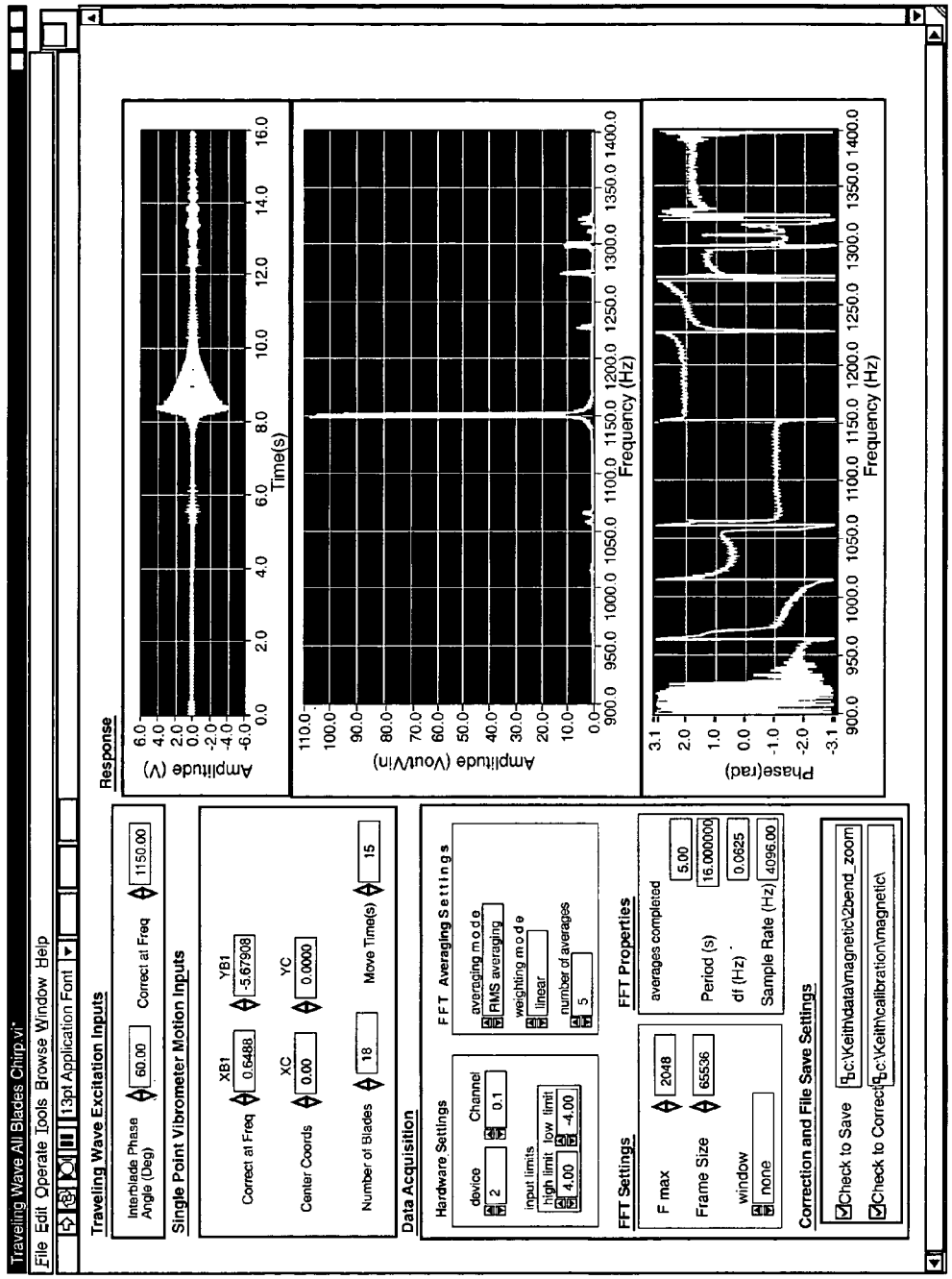
FIG. 5 shows a program for controlling the programmable, multi-channel amplitude and phase shifting circuit of the invention.

FIG. 5 shows LabVIEW™ software control panel which controls the programmable multi-channel amplitude and phase shifting circuit as well as other equipment involved in the traveling wave test.

There are many advantages to the method and device of the invention. For example, prior art methods of traveling wave excitation for turbine engine bladed disks adjusted the excitation signal gains to correct for variations in the exciter frequency responses. This was necessary to produce equal amplitude excitation on all blades. Although the frequency response variations involved phase as well as amplitude variations, only amplitude corrections could be made with previous systems. However, the amplitude and phase shifting circuit of the invention can correct for both amplitude and phase differences between exciters. This results in a more perfect simulation of the rotating forces experienced by turbine engine airfoils. Such precise excitation is important when studying the forced response of bladed disks which can be very sensitive to slight perturbations in structural and forcing properties.

From a practical viewpoint, there are also advantages to the method and device of the invention. For example, the programmable multi-channel amplitude and phase shifting circuit significantly reduces the per-channel cost for providing multi-channel amplitude and phase shifted sinusoids. This cost reduction can be significant for many applications where large numbers of amplitude and phase shifted signals are required. Examples include exciting turbine engine bladed disks containing many airfoils, active vibration control, and multiple shaker control for phased resonance testing.

There are many potential alternative modes of the invention. The amplitude and phase shifting circuit can be used for any application where multiple sinusoidal signals with different amplitudes and phases but identical frequencies are required.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. An inexpensive, programmable, frequency independent, amplitude and phase shifting circuit comprising:
   an enclosure comprising:
      means for holding printed circuit boards; and
      a front panel for receiving input and output signals;
   a motherboard comprising:
      means for supplying input signals through said front panel;
      a power source;
      digital control lines; and
      a demultiplexer circuit board;
   said demultiplexer circuit board within said motherboard comprising:
      a demultiplexer;

a plurality of signal receiving digital control lines coupled to the demultiplexer from a digital output card in a personal computer;

a plurality of signal sending digital control lines coupled to the demultiplexer routed to an amplitude/phase shifting circuit board; and means for selecting a single amplifier for operator selected amplitude or phase gain change over a single frequency or sweep in frequency;

an amplitude/phase shifting circuit board comprising:

a plurality of programmable gain operational amplifiers each including a plurality of data input lines and a select line, independent of the data input lines, one amplifier selected at a time through the select line, to have its gain/and or phase changed when an operator desires a new amplitude and/or phase, each of the programmable gain operational amplifiers further including a first input signal line to receive a sine signal waveform and a second input signal line to receive a cosine signal waveform each of the sine and cosin signal waveforms are of the same frequency;

a plurality of summing operational amplifiers, coupled to the plurality of programmable operational amplifiers, to sum the sine signal waveform and cosine signal waveform;

a plurality of output signal lines, coupled to the plurality of summing gain operational amplifiers, each output signal line to transmit a phase and/or amplitude shifted sinusoidal signal waveform having the same frequent as the summed sine signal waveform and cosine signal waveform; and means for controlling said amplitude/phase shifting circuit.

2. The amplitude and phase shifting circuit of claim 1 wherein said enclosure mounts onto a standard electronics rack.

3. The amplitude and phase shifting circuit of claim 1 wherein said means for controlling said amplitude/phase shifting circuit comprises a digital output card from a personal computer.

4. The amplitude and phase shifting circuit of claim 3 wherein said digital output card interfaces with said amplitude/phase shifting circuit through a 50 pin ribbon cable.

5. The amplitude and phase shifting circuit of claim 3 wherein an operator interfaces with said digital output card through software.

6. An inexpensive, programmable, frequency independent, multiple channel amplitude and phase shifting method comprising the steps of:

inputting sine and cosine signal waveforms, each having the same frequency, to two programmable gain operational amplifiers on an amplitude/phase shifting circuit board, each of the two programmable gain operation amplifiers having an output;

summing said outputs of said two programmable gain operational amplifiers using one summing operational amplifier on said amplitude/phase shifting circuit board to generate an amplitude and/or phase shifted sinusoidal signal waveform having the same frequency as the sine and cosine signal waveforms;

implementing four channels of said inputting and summing steps on said amplitude/phase shifting circuit board, each of said channels connected to a demultiplexer circuit board;

powering said demultiplexer circuit board and said amplitude/phase shifting circuit boards through a motherboard;

selecting one of said four channels for a gain and/or phase change through said demultiplexer circuit board over a single frequency or sweep in frequency;

controlling said programmable, multiple channel amplitude and phase shifting circuit;

sending said amplitude and phase shifted sinusoidal signal waveform having the same frequency as the sine and cosine signal waveforms to an output line interfacing with a panel on an enclosure containing said motherboard, said demultiplexer circuit board and said amplitude/phase shifting circuit board.

7. The inexpensive, programmable, frequency independent, multiple channel amplitude and phase shifting method of claim 6 wherein said controlling step further comprises controlling said programmable, multiple channel amplitude and phase shifting circuit using a digital output card from a personal computer.

8. The inexpensive, programmable, frequency independent, multiple channel amplitude and phase shifting method of claim 7 wherein said controlling step further comprises controlling said programmable, multiple channel amplitude and phase shifting circuit using a digital output card from a personal computer; and operator interfacing with said digital output card with software.

9. The inexpensive, programmable, frequency independent, multiple channel amplitude and phase shifting method of claim 6 wherein said selecting step further comprises the steps of:

determining timing and sequence of reading data lines from said motherboard;

storing data in a buffer; and changing gain of a selected operational amplifier over a single frequency or sweep in frequency.

10. The inexpensive, programmable, frequency independent, multiple channel amplitude and phase shifting method of claim 6 wherein said inputting step further comprises inputting sine and cosine signal waveforms to two programmable gain operational amplifiers on an amplitude/phase shifting circuit board through a motherboard.

11. A programmable, frequency independent, amplitude and phase shifting signal generating device comprising:

a plurality of amplitude/phase shifting circuits, wherein each of said amplitude/phase shifting circuits comprises:

a plurality of programmable gain operational amplifiers, each programmable gain operational amplifier including a select line and a plurality of data lines, the select line being independent of the data lines, the select line to receive a signal to enable a selected one of the plurality of programmable operational amplifiers to recognize data received on the plurality of data lines, each of the programmable gain operational amplifiers further including a first input signal line to receive a sine signal waveform and a second input signal line to receive a cosine signal waveform wherein each of the sine and cosine signal waveforms are of the same frequency, and a first output signal line and a second output signal line;

a plurality of summing operational amplifiers each coupled to one of the plurality of programmable operational amplifiers and to the first and second output signal lines of the programmable operational amplifiers, to sum the outputs on the first and second output signal lines to generate an amplitude and/or phase shifted sinusoidal signal waveform having the same frequency as the sine and cosine signal waveforms; and a demultiplexer circuit comprising:
  a demultiplexer;
  a plurality of signal receiving digital control lines coupled to the demultiplexer to receive control signals from a controller;
  a plurality of signal sending digital control lines coupled to the demultiplexer and coupled to the plurality of amplitude/phase shifting circuits; and
  a plurality of control lines coupled to the demultiplexer, one of the plurality of control lines being coupled to one the plurality of amplitude/phase shifting circuit boards, to select one of the plurality of amplitude/phase shifting circuit boards to provide an amplitude and/or phase shifted sinusoidal signal waveform having the same frequency as the sine and cosine signal waveforms.

12. A programmable, frequency independent, multiple channel amplitude and phase shifting signal generation method comprising the steps of
  generating a control signal over a select line and data signals over a plurality of data lines of a demultiplexer;
  receiving the control signal and the data signals at an amplitude/phase shifting circuit board have a plurality of channels, each of the channels being selected for operation by the control signal;
  inputting sine and cosine signal waveforms, each having the same frequency, to two programmable gain operational amplifiers on the amplitude/phase shifting circuit board, the two programmable gain operational amplifiers being selected by the control signal, each of the two programmable gain operation amplifiers having an output;
  summing the outputs of the two programmable gain operational amplifiers using a summing operational amplifier on the amplitude/phase shifting circuit board to generate an amplitude and/or phase shifted sinusoidal signal waveform having the same frequency as the sine and cosine signal waveforms;
  sending the amplitude and phase shifted sinusoidal signal waveform having the same frequency as the sine and cosine signal waveforms to an output connector for use; and
  selecting another of one of the plurality of channels to generate another amplitude and/or phase shifted sinusoidal signal waveform.

13. The programmable, frequency independent, multiple channel amplitude and phase shifting signal generation method of claim 12, wherein the generating step further comprises generating a new group of data signals during selection of another of the plurality of channels to thereby generate a new phase and/or amplitude shifted sinusoidal waveform signal different than the one previously generated.

14. The programmable, frequency independent, multiple channel amplitude and phase shifting signal generation method of claim 13, wherein the new phase and/or amplitude shifted sinusoidal waveform signal and the previously generated phase and/or amplitude shifted sinusoidal waveform signal have the same frequency but different phases and/or amplitudes.

* * * * *